United States Patent [19]

Grier et al.

[11] 4,014,845
[45] Mar. 29, 1977

[54] FUGITIVE VEHICLE SYSTEM

[75] Inventors: John D. Grier, Temperance; Lynn J. Taylor, Haslett, both of Mich.

[73] Assignee: Owens-Illinois, Inc., Toledo, Ohio

[22] Filed: Aug. 23, 1971

[21] Appl. No.: 174,197

[52] U.S. Cl. .................... 260/31.8 R; 260/30.2; 260/31.2 R; 260/31.4 R; 260/31.6; 260/32.4; 260/32.8 R; 260/33.2 R; 260/33.4 R; 260/33.6 UA; 260/33.8 UA

[51] Int. Cl.² ............... C08K 5/01; C08K 5/03; C08K 5/12

[58] Field of Search ............ 260/31.4 R, 33.6 PQ, 260/89.5 A, 31.8 R, 31.2 R, 33.4 R, 33.6 UA; 526/11.1

[56] References Cited

UNITED STATES PATENTS

| | | | |
|---|---|---|---|
| 3,060,148 | 10/1962 | Evans | 260/31.8 R |
| 3,526,522 | 9/1970 | Seregely | 260/33.6 PQ |
| 3,632,365 | 1/1972 | Gray | 117/3.4 |

OTHER PUBLICATIONS

Modern Plastics Encyclopedia for 1968, Sept. 1967, vol. 45/No. 1A, pp. 474–475.
McGraw-Hill, New York, pp. 470, 471, 478, 479, 486, 487.

*Primary Examiner*—Paul R. Michl
*Attorney, Agent, or Firm*—Donald Keith Wedding

[57] ABSTRACT

There is disclosed a fugitive vehicle system comprising at least two organic components, at least one component being a solid polymeric material capable of pyrolyzing in a non-oxygen containing environment and at least one other component being a solvent for the solid polymeric material, the solvent being capable of removal at a temperature below the pyrolyzing temperature of the polymeric material. This fugitive vehicle system is especially suitable in microelectronic applications.

6 Claims, No Drawings

FUGITIVE VEHICLE SYSTEM

This invention relates to a novel fugitive vehicle system comprising a solid polymeric material and a solvent.

Fugitive vehicle systems are generally well known in the prior art, as evidenced for example by U.S. Pat. No. 2,312,229 issued to Anderson which discloses a process for coating vitreous surfaces with fluorescent materials by suspending fluorescent powder in a binder comprising a solution of polystyrene in a solvent. Similar systems are disclosed by U.S. Pat. No. 2,328,101 issued to Rosenblatt and U.S. Pat. No. 3,475,161 issued to Ramirez.

Fugitive vehicle systems have been especially useful in the coating art. Thus particulate coating materials are commonly applied to substrates by a wet process, that is, while dispersed in a system consisting of a binder and a solvent. Such a process typically requires mixing of a binder, a solvent, and an inorganic material to form a paste or slurry which is applied to the surface to be coated.

The wet coating technique is commonly used to seal glass or ceramic parts, as in the formation of cathode ray tubes wherein the face plate is attached to the funnel. In this technique, a paste having solder glass distributed throughout a binder-solvent system is applied to the edges of one part in the form of a ribbon. The remaining part is then placed in contact with the paste and the assemblage is heated to evaporate the solvent, burn out the binder, and fuse the solder glass. While this technique is extensively used, quality control is difficult and expensive because of carbonaceous or like residue which may not be removed by evaporation or burning during the heating step. Likewise, during the evaporation of the solvent, there may be changes in the viscosity and/or thixotropic character of the system which may result in such deleterious effects as orange peel formation, fish eye formation, etc., especially on flat surfaces.

In an effort to overcome the difficulties inherent in applying a coating or sealant to substrates via a binder-solvent system, the prior art has used dry coating compositions containing polymeric binders and having the particulate coating material uniformly distributed therethrough. These compositions are formed into films which are applied to the substrate to be coated and then heated to burn out the binder and form a coating of the inorganic material usually in fused or sintered form. However, the presence of carbonaceous residue may still present a problem in such a system.

In copending U.S. Pat. application Ser. No. 825,410, filed May 16, 1969 by Fred E. Mansur and copending U.S. Pat. application Ser. No. 806,320, filed Mar. 11, 1969 by Don N. Gray and John D. Grier, both applications being assigned to the same assignee as the instant application, there are disclosed novel wet coating systems comprising liquid poly (alpha substituted) styrene dispersed in a cyclic isoprenoid solvent.

In accordance with the practice of this invention, there is provided a fugitive vehicle system comprising at least two organic components, at least one component being a solid polymeric material capable of pyrolyzing in a non-oxygen containing environment and at least one other component being a solvent for the polymeric material, the solvent being capable of removal at a temperature below the pyrolyzing temperature of the polymeric material.

As used herein, "pyrolyzing" is defined as the decomposition of the polymeric material to gaseous products without passing through a broad liquid range and without leaving a noticeable carbonaceous or other like residue which would interfere with the intended function of the system.

The polymeric material is one which will pyrolyze, as distinguished from vaporization, when appropriate energy is applied thereto at some predetermined energy level above the level of energy required to remove the solvent.

Energy level, as used herein, is intended to include any reasonably measurable molecular energy state which is related to the pyrolyzing of the polymer and/or removal of the solvent. The most obvious energy level is temperature, which has been defined as the average molecular kinetic energy. Hereinafter, temperature level will be used as a synonym for energy level. However, the invention is not limited to temperature level alone, but is intended to include any molecular energy level or state which can be obtained by any appropriate energy from any source or means, such as chemical, electrical, thermal, mechanical, sonic, etc. Likewise, the energy can be transmitted in any suitable form such as by electromagnetic radiation, visible or invisible, e.g. infra-red, ultra-violet, x-rays, gamma rays, and beta rays.

The polymeric material, when solvent-free, is solid under the conditions of handling, e.g. typically room or factory temperatures ranging from about 40° F. to about 120° F. However, more extreme temperatures are contemplated if the conditions of handling so warrant.

The use of a solid polymeric material is advantageous in that the material behaves as a binder during the interval between the evaporation of the solvent and the pyrolytic removal of the polymeric material. This may be especially important when the fugitive vehicle system is being loaded with other materials, e.g. for coating a substrate.

The polymeric material is typically selected from one or more pyrolyzable solid polymers or copolymers such as polyethers including poly (tetrahydrofuran), poly (1,3-dioxolane), and poly (alkylene oxides), especially poly (ethylene oxide) or poly (propylene oxide); poly (alkyl methacrylates) including those where the alkyl contains one to six carbons, especially poly (methyl methacrylate), poly (ethyl methacrylate), and poly (n-butyl methacrylate); methacrylate copolymers including methyl methacrylate/n-butyl methacrylate copolymers, methyl methacrylate/alpha methyl styrene copolymers, n-butyl methacrylate/alpha methyl styrene copolymers, methyl methacrylate/styrene copolymers, methyl methacrylate/dimethyl itaconate copolymers; and other selected polymers and copolymers including polyisobutylene; poly (trimethylene carbonate); poly (beta-propiolactone); poly (delta-valerolactone); poly (ethylene carbonate); poly (propylene carbonate); poly (ethylene oxalate); vinyl toluene/alpha-methylstyrene copolymers; styrene/alpha-methylstyrene copolymers; and olefin-sulfur dioxide copolymers.

In one specific embodiment hereof, there is used a polymeric material having oxygen atoms selectively incorporated in its molecular chain, as, for example, peroxy linkages in the chain. Such a pyrolyzable polymer is disclosed in copending U.S. Pat. application Ser. No. 653,020, filed July 13, 1967 by Dr. Don N. Gray and assigned to the same assignee as that of the instant patent application. The oxygen content may range between about 0.005 and about 1% by weight of the copolymer. Typically there is used a copolymer, terpolymer, or quadpolymer of oxygen and at least one monomer of alkyl methacrylate with the alkyl containing one to six carbon atoms, e.g. methyl to hexyl, preferably butyl. Copolymers of oxygen with other vinyl monomers may also be utilized.

The common characteristic of the selected polymeric material is that it must be solid at ambient temperature and pyrolyzable at an elevated temperature, e.g. about 250° C. to about 450° C.

This pyrolysis mechanism of removal of the composition of the invention is of great advantage in non-oxygen-containing atmospheres, but the compositions may also be used in an oxygen-containing atmosphere. This characteristic permits the use of a continuum of atmospheric pressures downward from somewhat less than 14.7 lbs. per sq. in. absolute to vacua approaching the micron range. Likewise, inert environments such as nitrogen, argon, etc. may be used.

The organic solvent component of the vehicle system comprises one or more organic solvents having a boiling temperature below the pyrolysis temperature of the polymer, e.g. within a range of about 100° C. to about 400° C., preferably about 200° C. to about 350° C. The use of high boiling solvents makes the fugitive system effectively non-drying at room temperature.

Examples of suitable solvents include polychlorinated polyphenyls (Arochlor 1221 or 1232, manufactured by Monsanto Chemical Co.,); dialkyl phthalates, such as dimethyl, diethyl, or di-n-butyl phthalate; di-n-butyl succinate; dimethyl sebacate; dibenzyl ether; butyl benzoate; acetyl triethyl citrate; glyceryl triacetate; beta-ethoxy ethyl benzoate; isoamyl benzoate; benzyl benzoate; isobutyl salicylate; isoamyl salicylate; benzyl salicylate; ethyl laurate; butyl oleate; ethyl myristate; butyl benzyl phthalate; dimethyl suberate; diethyl sebacate; diethyl azelate; di-n-butyl adipate; diisobutyl adipate; dibutyl sebacate; dibutyl tartrate; glyceryl tributyrate; diethyl isophthalate; butyl palmitate; dodecylbenzene; tetradecylbenzene; pentaethylbenzene; diphenylmethane; 1,1-diphenylethane; 1-chloronaphthalene; 1-bromonaphthalene; dimethylnaphthalene (various isomers, and mixtures thereof); 1-methoxy naphthalene; n-alkanes containing 14 to 20 carbon atoms and mixtures thereof; diphenyl ether; bis(alpha-methylbenzyl) ether; tetraethylene glycol dimethyl ether; 2-benzyloxyethanol; phenyl n-hexyl carbinol; triethylene glycol; 1,5-pentanediol; hexanophenone; 1-naphthyl methyl ketone; p-n-pentylphenol; N-cyclohexyl-2-pyrrolidone; glutaronitrile; and p-methoxyphenylacetonitrile. The selected solvent may also be thermally degradable to volatile products, e.g. within the boiling range temperatures indicated above.

Among the organic solvents, it is also possible to select some which act as plasticizers for the polymer, thereby obtaining a beneficial solvating effect.

The relative proportions of solvent (or plasticizer) and polymeric material will depend upon the respective types of materials. However, the weight ratio of solvent to polymeric material will generally be within a range of about 100:1 to about 1:100, preferably about 10:1 to about 1:10.

The fugitive vehicle composition of this invention has numerous advantages and utility depending upon what additional ingredients, if any, are incorporated therein. Such additional ingredients include not by way of limitation both liquid and solid substances such as pigments, fillers, resins, ceramics, glasses, etc.

The composition is especially advantageous in the formation of thick-film systems designed for processing in nonoxidizing atmospheres, e.g. as in the preparation of microelectronic circuits, devices, said components thereof. Another particular use comprises a glazing process wherein a powdered glass is applied to a substrate and subseqently melted to form a continuous film, e.g. such as a dielectric film in a gas discharge display/memory device.

I claim:

1. As a composition of matter, a fugitive vehicle system comprising at least two organic components, at least one component being a solid polymeric material at ambient temperature, said polymeric material being a copolymer, terpolymer, or quadpolymer of oxygen and at least one monomer of alkyl methacrylate with the alkyl containing 1 to 6 carbon atoms and being capable of pyrolyzing in a non-oxygen containing environment at an elevated temperature of about 250° C to about 450° C without leaving a carbonaceous residue, and at least one other component being a solvent for the polymer material, said solvent being selected from the group consisting of dimethyl phthalate; diethyl phthalate; di-n-butyl phthalate; di-n-butyl succinate; dimethyl sebacate; dibenzyl ether; butyl benzoate; acetyl triethyl citrate; glyceryl triacetate; beta-ethoxy ethyl benzoate; isoamyl benzoate; benzyl benzoate; isobutyl salicylate; isoamyl salicylate; benzyl salicylate; ethyl laurate; butyl oleate; ethyl myristate; butyl benzyl phthalate; dimethyl suberate; diethyl sebacate; diethyl azelate; di-n-butyl adipate; diisobutyl adipate; dibutyl sebacate; dibutyl tartrate; glyceryl tributyrate; diethyl isophalate; butyl palmitate; dodecylbenzene; tetradecylbenzene; pentaethylbenzene; diphenylmethane; 1,1-diphenylethane; 1-chloronaphthalene; 1-bromonaphthalene; dimethylnapthalene; 1-methoxy naphthalene; an n-alkane containing 14 to 20 carbon atoms; diphenyl ether; bis(alpha-methylbenzyl) ether; tetraethylene glycol dimethyl ether; 2-benzyloxyethanol; phenyl n-hexyl carbinol; triethylene glycol; 1,5-pentanediol; hexanophenone; 1-naphthyl methyl ketone; p-n-pentylphenol; N-cyclohexyl-2-pyrrolidone, glutaronitrile; and p-methoxyphenylacetonitrile; and having a boiling or decomposition temperature below the pyrolyzing temperature of the polymeric material, said temperature being in the range of about 100° C to about 400° C.

2. The composition of claim 1 wherein the alkyl is n-butyl.

3. The composition of claim 1 wherein the alkyl is methyl.

4. The composition of claim 1 wherein the solvent has a boiling or decomposition temperature within the range of about 200° C to about 350° C.

5. The composition of claim 1 wherein the weight ratio of solvent to polymeric material ranges from about 100:1 to about 1:100.

6. The composition of claim 1 wherein the total oxygen content of said copolymer is about 0.005 to about 1% by weight based on the total weight of said copolymer.

* * * * *